(12) United States Patent
Bruns et al.

(10) Patent No.: US 6,708,328 B1
(45) Date of Patent: Mar. 16, 2004

(54) EMPLOYMENT OF VALUE OF UNKNOWN IN PORTION OF PARTIAL STATE SPACE FOR ANALYSIS OF PART OF SYSTEM

(75) Inventors: Glenn R. Bruns, Naperville, IL (US); Patrice Ismael Godefroid, Naperville, IL (US)

(73) Assignee: Lucent Technologies Inc., Murray Hill, NJ (US)

( * ) Notice: Subject to any disclaimer, the term of this patent is extended or adjusted under 35 U.S.C. 154(b) by 0 days.

(21) Appl. No.: 09/465,578

(22) Filed: Dec. 17, 1999

(51) Int. Cl.$^7$ ............................ G06F 9/44; G06F 17/50; G06F 9/46; H02H 3/05

(52) U.S. Cl. ..................... 717/135; 703/17; 709/318; 714/38

(58) Field of Search ................................. 717/141, 146, 717/151–161, 124–135; 706/45–62; 703/13–28; 709/318; 714/38, 45; 326/60

(56) References Cited

U.S. PATENT DOCUMENTS

| 3,976,864 | A | * | 8/1976 | Gordon et al. | 714/45 |
| 4,224,534 | A | * | 9/1980 | Gordon | 326/60 |
| 5,764,883 | A | * | 6/1998 | Satterfield et al. | 714/38 |
| 6,141,633 | A | * | 10/2000 | Iwashita et al. | 703/15 |
| 6,324,496 | B1 | * | 11/2001 | Alur et al. | 703/17 |

OTHER PUBLICATIONS

Akama, Many–valued and Annoted Modal Logics, May 1998, Proceedings of the 28$^{th}$ IE International Symposium on Multiple–Vlaued Logic, 114–119.*
De Schutter–De Moor, State Space Transformations and State Space Realization in the Max Algebra, 12V/1995, IEEE, Proceedings of the 34$^{th}$ Conference on Decision & Control.*
Verlind et al., A Time Abstraction Method for Efficient Verification of Communicating Systems, Jun. 1994, 31$^{st}$ ACM/IEEE Design Automation Conference.*
Bruns, Glenn; Godefroid, Patrice; "Model Checking Partial State Spaces with 3–Valued Temporal Logics," Computer Aided Verification Undated.

* cited by examiner

Primary Examiner—Hoang-Vu Antony Nguyen-Ba

(57) ABSTRACT

A first system for analysis of a portion of a partial state space includes a representation component and an analysis component. The portion of the partial state space is related to a part of a second system. The representation component of the first system employs a value in the portion of the partial state space to represent that information for the part of the second system is unknown. The analysis component of the first system employs the value in the portion of the partial state space to analyze, in response to an analysis question that is related to the part of the second system, the portion of the partial state space.

23 Claims, 6 Drawing Sheets

100

100

300

US 6,708,328 B1

EMPLOYMENT OF VALUE OF UNKNOWN IN PORTION OF PARTIAL STATE SPACE FOR ANALYSIS OF PART OF SYSTEM

TECHNICAL FIELD

This invention relates generally to analysis of systems and more particularly to analysis of a partial state space that represents information for part of a system.

BACKGROUND OF THE INVENTION

To perform analysis of a system such as a computer system, one typically employs a description of the system. This system description, in one example, comprises a program such as a computer program, or an implementation of a design in a computer language or notation.

A number of techniques exist for employing the system description to obtain a state space that can be used in analyzing the system. This state space includes a description of a particular state of the system. One typically wishes that the state space also include a number of next states for the system. The accuracy of this information regarding a next state for the system, usually. depends on the accuracy of the representation of the present state of the system, as will be understood by those skilled in the art.

In one example, the state space comprises a graph. The graph typically includes an initial state. One commonly builds the graph, with employment of the description of the system, by exploring the next states that are reachable from the initial state. This process usually continues until the graph comprises every next state that one can reach. So, the process assumes that sufficient storage space will be available to hold a description of every state.

However, one can consider a description of a system that would require more space than is available in storage. The description could be larger than the available space in, for example, a data structure that is intended to store the description.

In one example, a given data structure has space sufficient to hold a description of a first system having, for instance, ten million states. One can also consider a description of a second system that has twenty billion states. The challenge remains of how to employ the given data structure to represent the description of the second system in view of the space limitations of the given data structure.

In this regard, one existing design simply cuts off the building of the state space upon reaching the limit of available memory. This cutting off affects at least one node in the graph by incompletely representing all possible transitions from that node. A shortcoming of such a cutoff technique in building the state space, is a possible inaccuracy in analysis of the system.

Should one wish to employ the state space to determine whether a condition such as a loop or deadlock exists in the system, the analysis could output an inaccurate answer. As one example, the analysis may reach a tentative conclusion that no, loop exists. Nevertheless, the analysis cannot definitively state, on the basis of an evaluation of the node affected by the cutoff, that no loop exists in the system, since data related to at least one transition from the node is not represented in the state space.

Thus, a need exists for employment of a value; in a state space that can be used for analysis of a system which is incompletely described in the state space.

SUMMARY OF THE INVENTION

Pursuant to the present invention, shortcomings of the existing art are overcome and additional advantages are provided through the provision of employment of a value of unknown in a portion of a partial state space for analysis of part of a system.

The invention in one embodiment encompasses a method for analyzing a portion of a partial state space, with the portion of the partial state space related to a part of a system. There is received an analysis question that is related to the part of the system. There is employed a value of unknown of the portion of the partial state space to analyze, in response to the analysis question, the portion of the partial state space.

Another embodiment of the invention encompasses a first system for analysis of a portion of a partial state space, with the portion of the partial state space related to a part of a second system. The first system includes a representation component and an analysis component. The representation component employs a value in the portion of the partial state space to represent that information for the part of the second system is unknown. The analysis component employs the value to analyze, in response to an analysis question that is related to the part of the second system, the portion of the partial state space.

A further embodiment of the invention encompasses an article of manufacture. At least one computer usable medium has computer readable program code means embodied therein for causing analysis of a portion of a partial state space, with the portion of the partial state space related to a part of a system. There is provided computer readable program means for causing a computer to receive an analysis question that is related to the part of the system. There is also provided computer readable program code means for causing a computer to employ a value of unknown of the portion of the partial state space to analyze, in response to the analysis question, the portion of the partial state space.

DETAILED DESCRIPTION

In accordance with the principles of the present invention, a value of unknown of a portion of a partial state space is employed to analyze the portion of the partial state space in response to an analysis question. For instance, the value of unknown is assigned to the portion of the partial state space to represent that information for a part of a system related to the portion of the partial state space, is unknown.

Figure 1:
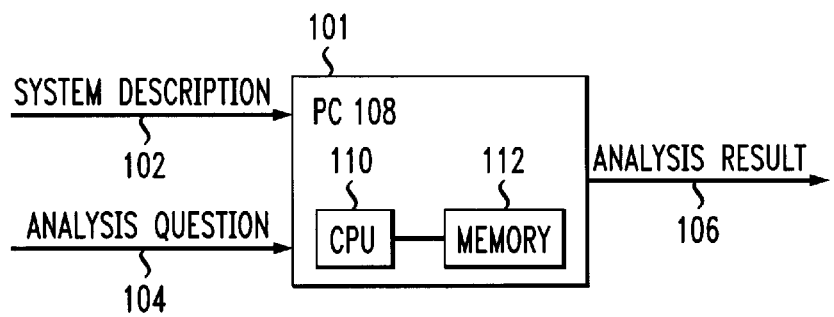
FIG. 1 is a functional block diagram of one example of a system that receives a description and a question, and outputs a result.

Referring to FIG. 1, implementation 100 comprises system 101. System 101, in one example, receives description 102 and question 104, and outputs result 106. System 101 comprises, for instance, a computing device such as personal computer ("PC") 108. PC 108 includes a processor such as central processing unit ("CPU") 110 coupled with a storage device such as memory 112. Description 102 comprises, for example, a system description. Question 104 comprises, for instance, an analysis question such as an expression or formula of logic, for example, temporal logic. Result 106 comprises, for instance, an analysis result.

One example of question 104 as a temporal logic formula comprises an expression of computation-tree logic ("CTL"). As will be understood by the skilled in the art, one builds a formula of CTL by combining basic propositions that employ logical operators. Exemplary logical operators of CTL include propositional operators and temporal operators. For instance, propositional operators include "conjunction" and "disjunction." One example of a temporal operator comprises "until," as will be appreciated by those skilled in the art.

Figure 2:
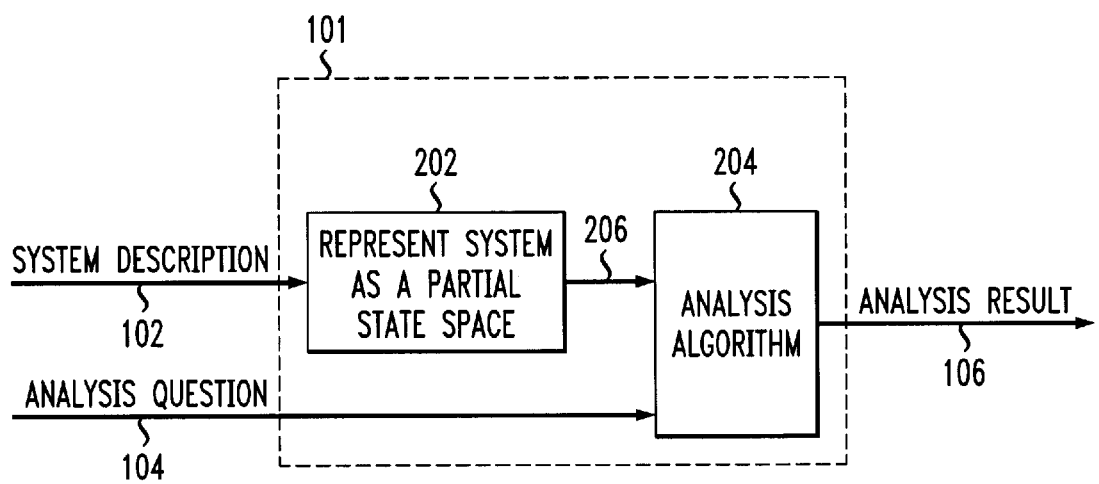
FIG. 2 is a functional block diagram that depicts a representation component and an analysis component of the system of FIG. 1.

Turning to FIG. 2, one example of system 101 includes representation component 202 coupled with analysis component 204. Representation component 202 receives system description 102 and provides to analysis component 204, a representation such as partial state space 206. In one example, partial state space 206 comprises a partial Kripke structure, as will be appreciated by those skilled in the art. Analysis component 204 receives partial state space 206 and question 104 as inputs, and provides result 106 as an output.

Figure 4:
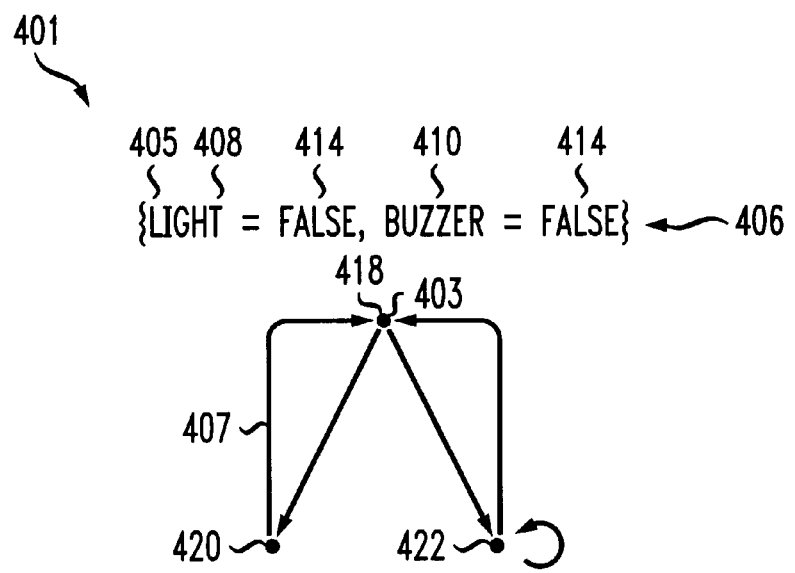
FIG. 4 depicts one example of a partial state space, related to the system of FIG. 3, that is output from the representation component of FIG. 2.

Again referring to FIG. 2, one example of result 106 output from analysis component 204 comprises a value such as value of TRUE 412 (FIG. 4), value of FALSE 414 (FIG. 4), or value of UNKNOWN 416 (FIG. 4). For instance, analysis component 204 (FIG. 2) outputs value of UNKNOWN 416 as result 106 when analysis component 204 determines that an answer to question 104 depends on a variable 405 (FIG. 4) that has value of UNKNOWN 416 in partial state space 206, as described herein.

Figure 3:
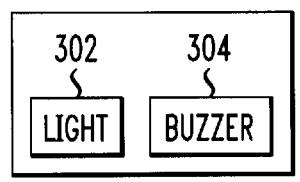
FIG. 3 depicts one example of a system that can be described by the received description of FIG. 1.

Turning to FIG. 3, system 300 comprises one example of a system that can be described by description 102 (FIG. 1). In one example, system 300 comprises a visual element, for instance, light 302, and an audio element, for instance, buzzer 304.

FIG. 4 represents one example of partial state space 206 that is provided from representation component 202 (FIG. 2) to analysis component 204 (FIG. 2). For instance, partial state space 206 comprises a graph such as directed graph 401, as will be appreciated by those skilled in the art. Directed graph 401, in one example, comprises a number of nodes 403 such as nodes 418, 420, and 422.

Again referring to FIG. 4, an instance of node 403 in directed graph 401 comprises a number of edges 407 to other instances of nodes 403 of partial state space 206. As will be appreciated by those skilled in the art, one can proceed along an edge 407 from one instance of node 403 to another instance of node 403, for example, through different types of events or actions. In one example, a given edge 407 represents instructions in a programming language. In another example, an edge 407 represents an outside event such as an event external to system 101.

Referring still to FIG. 4, a given node 403 comprises a number of variables 405, such as variables 408 and 410. In one example, a given node 403 corresponds to a state 406 in partial state space 206, as will be appreciated by those skilled in the art. In a further example, variable 405 comprises a value assigned by representation component 202 (FIG. 2), such as value of TRUE 412, value of FALSE 414, or a value of UNKNOWN 416. For example, a given variable 405 comprises a proposition in partial state space 206. For instance, the proposition comprises a basic unit within a logical formula, as will be appreciated by those skilled in the art.

Now referring to FIGS. 3–4, variable 408 of partial state space 206, in one example, relates to light 302 of system 300, and variable 410 of partial state space 206 relates to buzzer 304 of system 300. For instance, variable 408 indicates whether light 302 is ON or OFF. In one example, variable 408 comprises value of TRUE 412 if light 302 is ON. In addition, variable 408 comprises value of FALSE 414 if light 302 is OFF. If one cannot determine in partial state space 206 whether light 302 is ON or OFF, then variable 408 comprises value of UNKNOWN 416.

In a further example, referring still to FIGS. 3–4, variable 410 indicates whether or not buzzer 304 is SOUNDING or NOT SOUNDING. Variable 410 comprises value of TRUE 412 if buzzer 304 is SOUNDING. Variable 410 comprises value of FALSE 414 if buzzer 304 is NOT SOUNDING. If one cannot determine in partial state space 206 whether buzzer 304 is SOUNDING or NOT SOUNDING, then variable 410 comprises value of UNKNOWN 416.

Figure 5:
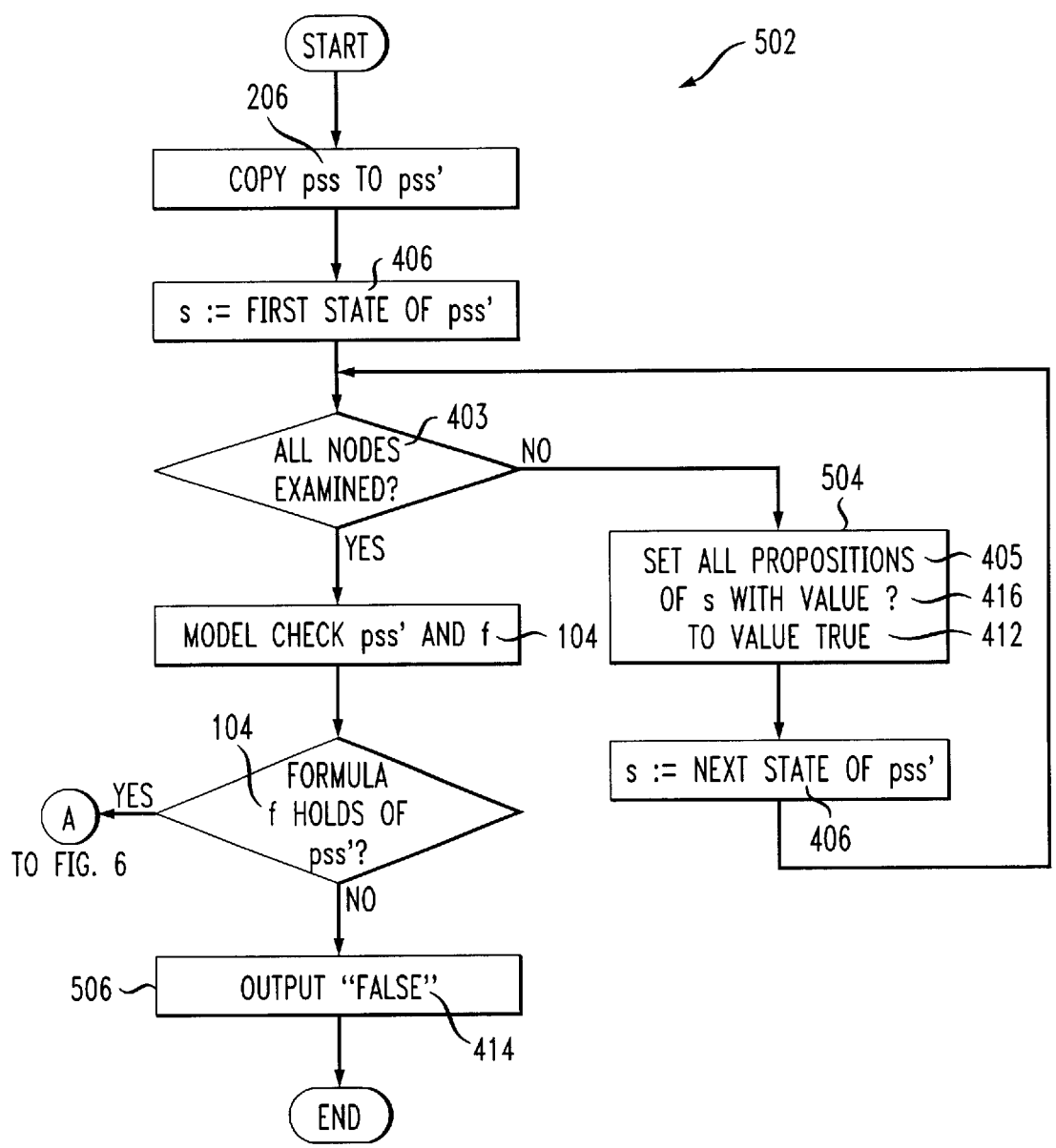
FIGS. 5–6 depict one example of logic employed by the analysis component of FIG. 2.
Figure 6:
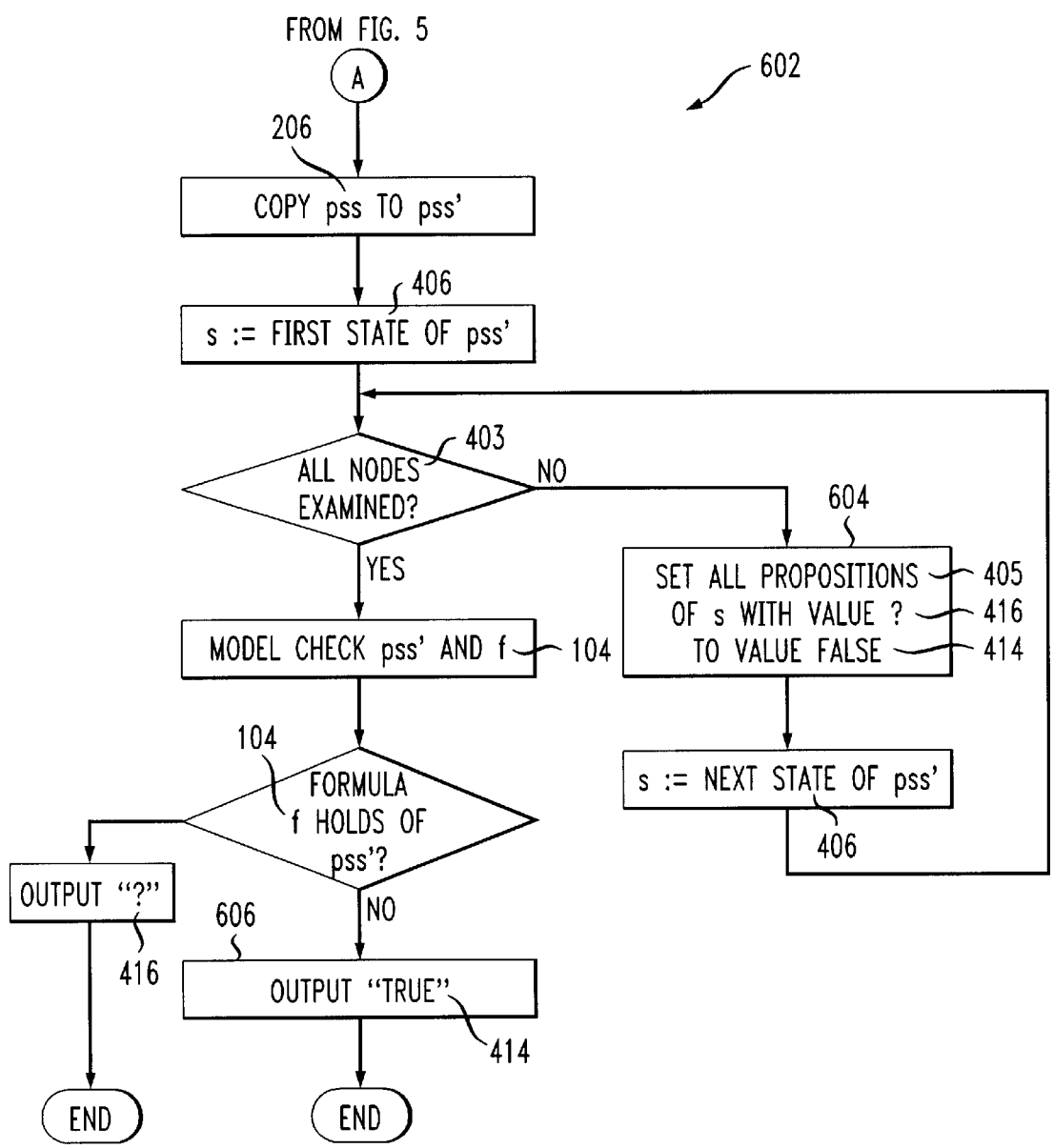

Turning to FIGS. 5–6, logic 500 comprises one example of logic employable by analysis component 204 (FIG. 2) that receives partial state space 206 (FIGS. 2 and 4). Logic 500 comprises, for instance, optimistic component 502 and pessimistic component 602.

Referring to FIG. 5, one example of optimistic component 502 employs STEP 504. STEP 504, in one example, comprises an assumption that a given value of UNKNOWN 416 in partial state space 206 actually corresponds to value of TRUE 412. Optimistic component 502 advantageously outputs a value of FALSE 414 in STEP 506 if the assumption at STEP 414 that each value of UNKNOWN 416 corresponds to value of TRUE 412, results in a value of FALSE 414 as a response to question 104.

Referring to FIG. 6, one example of pessimistic component 602 employs STEP 604. STEP 604, in one example, comprises an assumption that a given value of UNKNOWN 416 in partial state space 206 actually corresponds to value of FALSE 414. Pessimistic component 602 advantageously outputs a value of TRUE 412 in STEP 606 if the assumption that each value of UNKNOWN 416 corresponds to value of FALSE 414 in STEP 604, results in a value of TRUE 412 as a response to question 104.

Referring again to FIGS. 5–6, if optimistic analysis 502 fails to reach STEP 506 and output value of FALSE 414, and pessimistic analysis 602 fails to reach STEP 606 and output value of TRUE 412, then logic 500 reaches STEP 608 and advantageously outputs value of UNKNOWN 416 in response to question 104. So, logic 500 outputs value of UNKNOWN 416 in the event that neither the optimistic assumption of analysis 502 obtains the result of FALSE 414 nor the pessimistic assumption of analysis 602 obtains the result of TRUE 412, as will be appreciated by those skilled in the art.

For instance, when logic 500 obtains a result of UNKNOWN 416, implementation 100 (FIG. 1) can select another portion of system 300 (FIG. 3) for analysis in response to a second question 104 (FIG. 1). This other portion of system 300 can comprise a relatively-decreased complexity portion of system 300, as will be appreciated by those skilled in the art. In addition, this other portion of system 300 can comprise an overlapping or a non-overlapping portion of system 300. The second analysis question 104 can be based on a result of previous analysis that employs a prior question 104. In one example, any portion of logic 500 and/or implementation 100 can comprise recursion, iteration, branching and/or the like.

Figure 7:
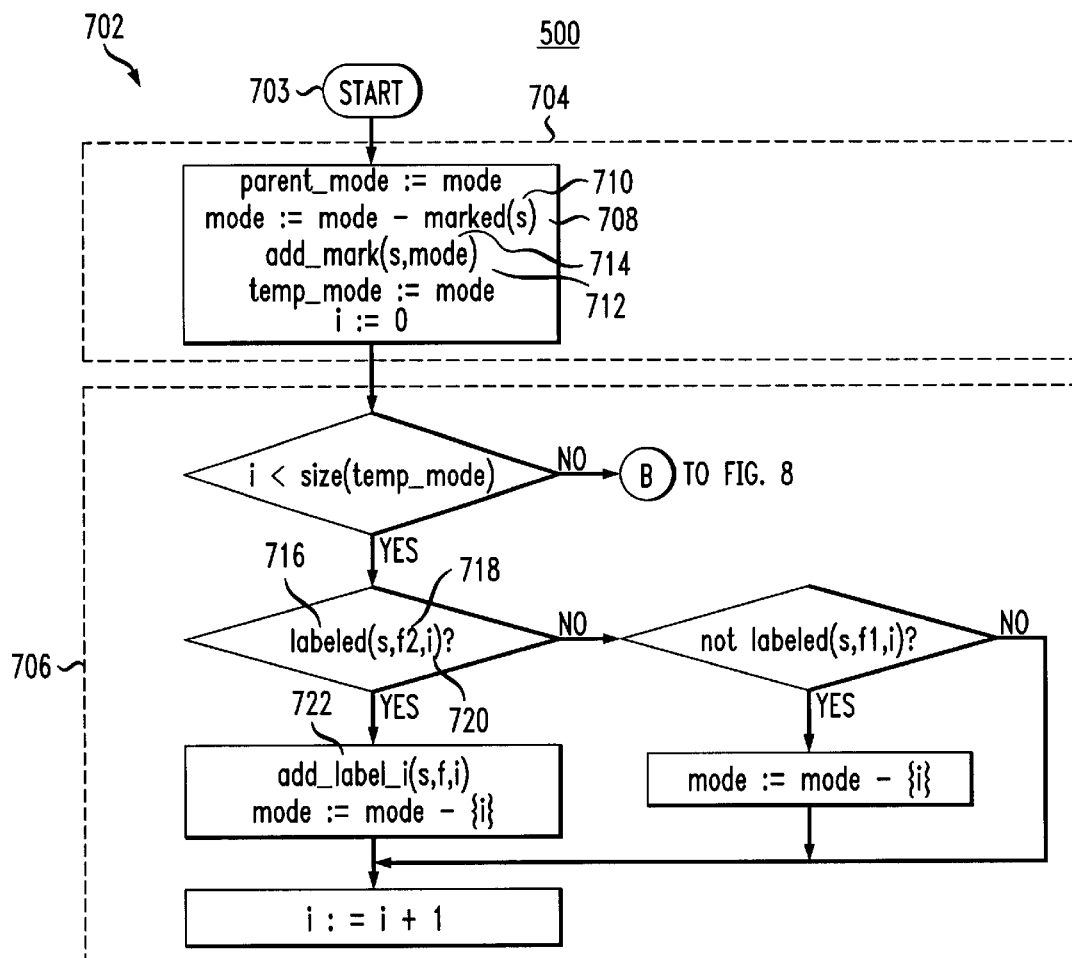
FIGS. 7–9 depict another example of logic employed by the analysis component of FIG. 2.
Figure 8:
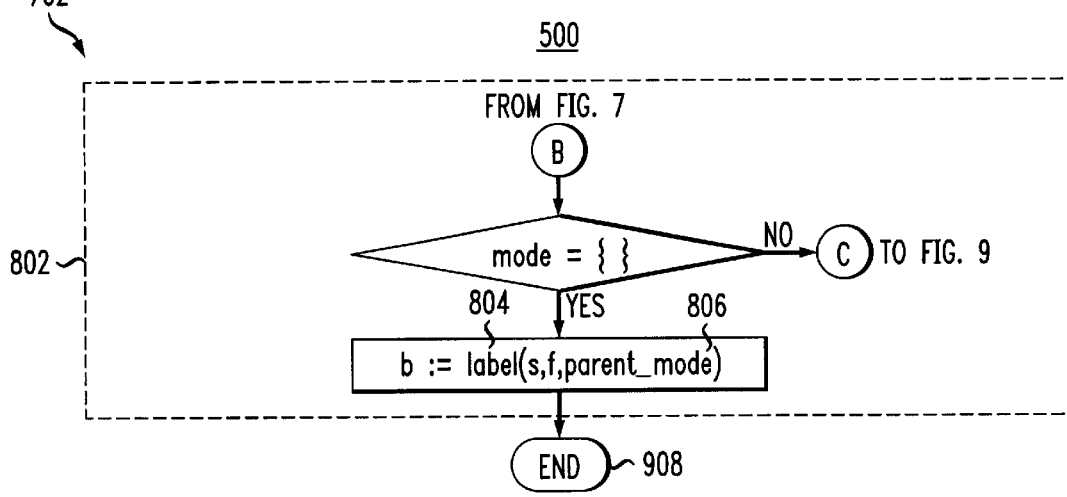
Figure 9:
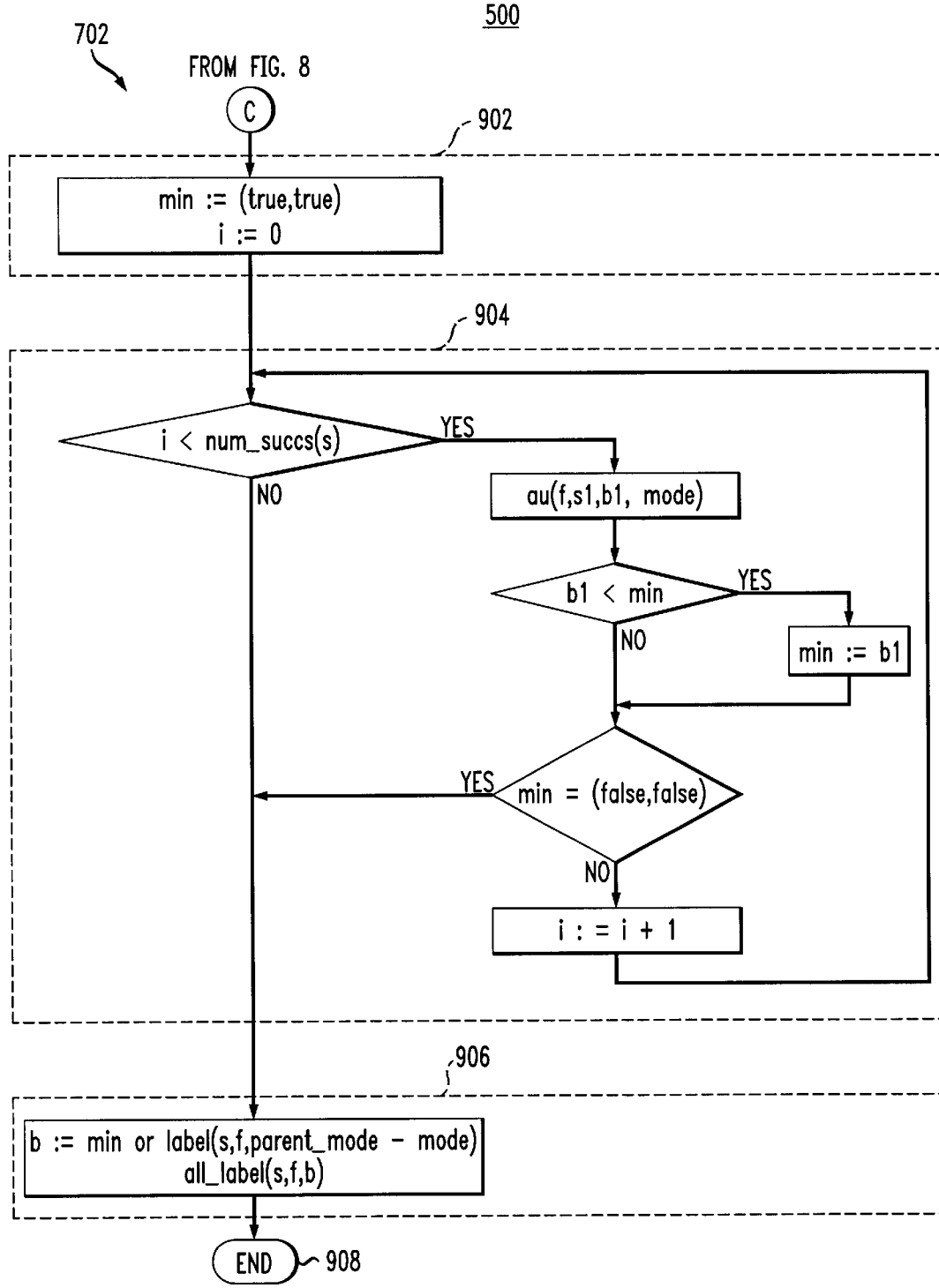

Another example of logic 500 employable by analysis component 204 (FIG. 2), is presented in FIGS. 7–9 and described herein.

In one advantageous aspect, merged analysis 702 of logic 500 (FIGS. 7–9), in one example, allows performance of an optimistic analysis and a pessimistic analysis in a single search of partial state space 206. In a further example, merged analysis 702 allows contemporaneous and/or simultaneous performance of the optimistic analysis and the pessimistic analysis and/or portions thereof.

Again referring to FIGS. 7–9, merged analysis 702, in one example, comprises an algorithm such as a model-checking algorithm for CTL that starts with basic propositions, and continues by handling operators one at a time until the algorithm has handled all operators of question 104 (FIG. 2), for instance, that comprises a formula of CTL, as will be appreciated by those skilled in the art.

For illustrative purposes, FIGS. 7–9 illustrate an algorithm that performs a merged analysis 702 for the operator "until" of CTL. Through examination of FIGS. 7–9 and the description herein, a skilled artisan will understand implementation of merged analysis 702 for the other operators of CTL.

Still referring to FIGS. 7–9, logic 500 includes START 703, SECTIONS 704, 706, 802, 902, 904, and 906, and END 908. In one example, START 703, SECTIONS 704, 706, 802, 902, 904, and 906, and END 908 comprise an algorithm such as merged analysis 702.

For instance, one can consider merged analysis 702 of logic 500 presented in FIGS. 7–9, to comprise an analysis that is merged relative to optimistic analysis 502 and pessimistic analysis 602 of logic 500 presented in FIGS. 5–6. For exemplary purposes, FIGS. 7–9 present a merged analysis 702 that advantageously provides contemporaneous performance of both optimistic and pessimistic analyses in a single search, rather than, for instance, two separate searches of partial state space 206.

Now referring to FIG. 7, START 703 proceeds to SECTION 704. SECTION 704 serves to initialize variables. SECTION 704 proceeds to SECTION 706. SECTION 706 serves to determine if merged analysis 702, by inspection of state S 710, can obtain a result for the optimistic analysis or the pessimistic analysis. SECTION 706 proceeds to SECTION 802 of FIG. 8.

Referring now to FIG. 8, SECTION 802 serves to determine whether or not results for all searches have been obtained. SECTION 802 proceeds to END 908 if the results for all searches have been obtained. If not, SECTION 802 proceeds to SECTION 902 of FIG. 9.

Referring to FIG. 9, SECTION 902 serves to initialize variables for SECTION 904. SECTION 902 proceeds to SECTION 904. SECTION 904 serves to recursively employ an algorithm on successor states in partial state space 206 (FIGS. 2 and 4). SECTION 904 proceeds to SECTION 906. SECTION 906 combines the results provided from SECTION 706 (FIG. 7) and SECTION 904. SECTION 906 proceeds to END 908.

Referring again to FIGS. 7–9, merged analysis 702 marks and labels states of partial state space 206, (FIGS. 2 and 4). Function MARKED(S) 708 of SECTION 704 serves to give a marking of state S 710. Function ADD_MARK(S, MODE) 712 of SECTION 704 serves to give state S 710 the marking of MODE 714. State S 710 is marked with an optimistic indication if merged analysis 702 has completed an optimistic analysis for the state S 710. State S 710 is marked with a pessimistic indication if merged analysis 702 has completed a pessimistic analysis for the state S 710.

Still referring to FIGS. 7–9, function LABELLED 716 of SECTION 706 indicates the labelling of the state S 710. In one example, state in partial state space 206 is labelled with an optimistic set of formulas and a pessimistic set of formulas. If variable I 720 has value O, function LABELLED 716 returns TRUE 412 if formula F 718 is a member of the optimistic set of formulas serving to label state S 710, and otherwise returns FALSE 414. If variable I 720 has value P, then function LABELLED 716 returns TRUE 412 if formula F 718 is a member of the pessimistic set of formulas serving to label state S 710, and otherwise returns FALSE 414.

In a further example, referring to FIGS. 7–9, function ADD_LABEL_I 722 of SECTION 706 adds formula F 718 to the optimistic set of formulas serving to label state S 710 if variable I 720 has value O, and adds formula F 718 to the pessimistic set of formulas serving to label state S 710 if variable I 720 has value P.

Additionally referring to FIGS. 7–9, function LABEL 804 of SECTION 802 returns a pair of values. The first value of the pair is TRUE 412 if variable PARENT_MODE 806 contains value P and formula F 718 is a member of the pessimistic set of formulas serving to label state S 710. Otherwise, the first value of the pair is FALSE 806. Also, the second value of the pair is TRUE 412 if variable PARENT_MODE 806 contains value O and formula F 718 is a member of the optimistic set of formulas serving to label state S 710. Otherwise, the second value of the pair is FALSE 414.

Although preferred embodiments have been depicted and described in detail herein, it will be apparent to those skilled in the relevant art that various modifications, additions, substitutions and the like can be made without departing from the spirit of the invention and these are therefore considered to be within the scope of the invention as defined in the following claims.

What is claimed is:

1. A method for analyzing a portion of a partial state space, the portion of the partial state space related to a part of a system, the method comprising the steps of:
   receiving an analysis question that is related to the part of the system; and
   employing a value of unknown of the portion of the partial state space to analyze, in response to the analysis question, the portion of the partial state space;
   wherein the portion of the partial state space comprises a first portion of the partial state space, wherein the part of the system comprises a first part of the system, wherein the analysis question comprises a first analysis question, in combination with a method for analyzing a second portion of the partial state space, the second portion of the partial state space related to a second part of the system, further comprising the step of employing, based on the step of employing the value of unknown to analyze the first portion of the partial state space, a second analysis question that is related to the second part of the system.

2. The method of claim 1 wherein the step of receiving the first analysis question that is related to the first part of the system comprises the step of receiving a temporal logic formula that is related to the first part of the system.

3. The method of claim 1 in combination with a method for representing, in the first portion of the partial state space, the first part of the system, further comprising the steps of:

determining that, in the first portion of the partial state space, information for the first part of the system is unknown; and employing the value of unknown to represent that the information for the first part of the system is unknown.

4. The method of claim 3 wherein the value of the first portion of the partial state space comprises a first value of the portion of the partial state space, in combination with a method for representing, in the second portion of the partial state space, the second part of the system, further comprising the steps of:

determining that, in the second portion of the partial state space, information for the second part of the system is known; and employing a second value in the second portion of the partial state space to represent that the information for the second part of the system is known.

5. The method of claim 1 wherein the value of unknown of the first portion of the partial state space comprises a first value of the first portion of the partial state space, and further comprising the step of employing a second value of the second portion of the partial state space to analyze, in response to the second analysis question, the second portion of the partial state space.

6. The method of claim 5 wherein the step of employing the second value of the second portion of the partial state space to analyze, in response to the second analysis question, the second portion of the partial state space comprises the step of determining, in the second portion of the partial state space, whether information for the second part of the system is known or unknown.

7. The method of claim 1 wherein the step of employing the value of unknown of the first portion of the partial state space to analyze, in response to the first analysis question, the first portion of the partial state space comprises the step of employing an assumed value for analysis of the first portion of the partial state space.

8. The method of claim 7 wherein the step of employing the assumed value for analysis of the first portion of the partial state space comprises the step of performing at least one of a portion of a relatively optimistic analysis and a portion of a relatively pessimistic analysis.

9. The method of claim 8 wherein the step of performing the at least one of the portion of the relatively optimistic analysis and the portion of the relatively pessimistic analysis comprises the step of contemporaneously performing a first analysis and a second analysis in a search.

10. The method of claim 1 further comprising the step of selecting the partial state space to comprise a partial Kripke structure.

11. A first system for analyzing a portion of a partial state space, the portion of the partial state space related to a part of a second system, the first system comprising:

a representation component that employs a value in the portion of the partial state space to represent that information for the part of the second system is unknown; and an analysis component that employs the value to analyze, in response to an analysis question that is related to the part of the second system, the portion of the partial state space;

wherein the portion of the partial state space comprises a first portion of the partial state space, wherein the part of the second system comprises a first part of the second system, wherein the analysis question comprises a first analysis question, in combination with a system for analyzing a second portion of the partial state space, the second portion of the partial state space related to a second part of the second system, wherein the representation component employs, based on an employment of the value of unknown by the representation component to analyze the first portion of the partial state space, a second analysis question that is related to the second part of the second system.

12. The first system of claim 11 wherein the first analysis question comprises a temporal logic formula that is related to the first part of the second system.

13. The first system of claim 11 in combination with a system for representing, in the first portion of the partial state space, the first part of the second system, wherein the representation component determines that, in the first portion of the partial state space, the information for the first part of the second system is unknown.

14. The first system of claim 13 wherein the value of the first portion of the partial state space comprises a first value of the first portion of the partial state space, in combination with a system for representing, in the second portion of the partial state space, the second part of the second system, wherein the representation component determines that in the second portion of the partial state space, information for the second part of the second system is known, and wherein the representation component employs a second value in the second portion of the partial state space to represent that the information for the second part of the second system is known.

15. The first system of claim 11 wherein the value of unknown of the first portion of the partial state space comprises a first value of the first portion of the partial state space, and wherein the analysis component employs a second value of the second portion of the partial state space to analyze, in response to the second analysis question, the second portion of the partial state space.

16. The first system of claim 15 wherein the representation component determines whether information for the second part of the second system is known or unknown.

17. The first system of claim 11 wherein the analysis component employs an assumed value for analysis of the first portion of the partial state space.

18. The first system of claim 17 wherein the analysis component employs the assumed value to perform at least one of a portion of a relatively optimistic analysis and a portion of a relatively pessimistic analysis.

19. The first system of claim 18 wherein the analysis component contemporaneously performs a first analysis and a second analysis in a search.

20. The first system of claim 11 wherein the partial state space comprises a partial Kripke structure.

21. An article of manufacture, comprising:

at least one computer usable medium having computer readable program code means being embodied therein for causing analysis of a portion of a partial state space, the portion of the partial state space related to a part of a system, the computer readable program code means in the article of manufacture comprising:

computer readable program code means for causing a computer to receive an analysis question that is related to the part of the system; and computer readable program code means for causing a computer to employ a value of unknown of the portion of the partial state space to analyze, in response to the analysis question, the portion of the partial state space;

wherein the portion of the partial state space comprises a first portion of the partial state space, wherein the part of the system comprises a first part of the system, wherein the analysis question comprises a first analysis question, wherein the at least one computer usable medium includes second computer readable program code means embodied therein for causing analysis of a second portion of the partial state space, the second portion of the partial state space related to a second part of the system, the second computer readable program code means in the article of manufacture comprising computer readable program code means for causing a computer to employ, based on an employment of the value of unknown, a second analysis question that is related to the second part of the system.

22. The article of manufacture of claim 21 wherein the at least one computer usable medium includes second computer readable program means embodied therein for causing representation, in the first portion of the partial state space, of the first part of the system, the second readable program code means in the article of manufacture comprising:

computer readable program code means for causing a computer to determine that, in the first portion of the partial state space, information for the first part of the system is unknown; and computer readable program code means for causing a computer to employ the value of unknown to represent that the information for the first part of the system is unknown.

23. The article of manufacture of claim 21 wherein the computer readable program means for causing a computer to employ the value of unknown of the first portion of the partial state space to analyze, in response to the first analysis question, the first portion of the partial state space comprises computer readable program means for causing a computer to employ an assumed value for analysis of the first portion of the partial state space.

* * * * *